United States Patent
Oyama

[11] Patent Number: 5,153,983
[45] Date of Patent: Oct. 13, 1992

[54] ROTARY HEAD TYPE ELECTRICAL COMPONENT PLACING APPARATUS

[75] Inventor: Kenshu Oyama, Fukuoka, Japan

[73] Assignee: Matsushita Electric Industrial Co., Ltd., Osaka, Japan

[21] Appl. No.: 651,840

[22] Filed: Feb. 7, 1991

[30] Foreign Application Priority Data

Feb. 15, 1990 [JP] Japan .................. 2-035141

[51] Int. Cl.⁵ .......................... H05K 13/05
[52] U.S. Cl. .......................... 29/740; 29/759; 29/834
[58] Field of Search .......... 29/740, 741, 739, 834–836, 29/759

[56] References Cited

U.S. PATENT DOCUMENTS

4,631,816  12/1986  Fujita et al. ............. 29/740
4,999,909   3/1991  Eguchi et al. ............ 29/740
5,033,185   7/1991  Hidese .................. 29/743 X

FOREIGN PATENT DOCUMENTS

62-259731  11/1987  Japan .

Primary Examiner—Carl E. Hall
Attorney, Agent, or Firm—Stevens, Davis, Miller & Mosher

[57] ABSTRACT

An electrical component placing apparatus is provided which includes a support body; a first table mounted on the support body; a rotary head which undergoes indexed rotation and includes a pick and place head; an X-Y table which moves a printed circuit board in X-Y directions; a second table mounted on the support body and including an electrical component placing portion; an electrical component supplying device mounted on the second table; and an assembly for laterally reciprocatingly moving the first and second tables independently of one another relative to the support body. The electrical component supplying unit includes a tray supplying unit having at least one tray for containing an electrical component and a sub pick and place head for picking up the electrical component contained in the tray and placing it onto the placing portion of the second table.

4 Claims, 4 Drawing Sheets

ROTARY HEAD TYPE ELECTRICAL COMPONENT PLACING APPARATUS

BACKGROUND OF THE INVENTION

1. Field of the Invention

This invention relates to a rotary head type electrical component placing apparatus and, more particularly, to an apparatus having an electrical component supplying device provided with a tray and a table reciprocating on a body for picking and placing an electronic component such as a QFP contained in the tray onto a printed circuit board while reciprocating the electrical component supplying device laterally integrally with the table.

2. Description of the Prior Art

A conventional rotary head type electrical component placing apparatus is provided to reciprocate a table provided in a body, to pick up an electrical component of a feeder such as a tape unit placed on the table by a pick and place head and to pick and place it onto a printed circuit board positioned on an X-Y table (e.g., see Japanese Patent Application Laid-Open Nos. 60-28288 and 52-140499).

The tape unit picks up an electrical component contained in the pocket of a tape containing the electrical component by a pick and place head while introducing the tape from a reel, and picks and places the electrical component onto a printed circuit board.

An electrical component such as a chip condenser or a chip resistor can be contained in the tape. However, since an electrical component such as a QFP must be subjected to an intermediate processing such as inspecting, drying, etc., such electrical component is not contained in the tape but rather in a tray. Therefore, an electrical component contained in the tape is heretofore placed onto a printed circuit board by a rotary head type electrical component placing apparatus, whereas an electrical component such as a QFP is placed separately onto a printed circuit board by a single head type electrical component placing apparatus as disclosed, for example, in Japanese Patent Application Laid-Open Nos. 62-259731 and 62-42597. The single head type electrical component placing apparatus picks and places an electrical component onto a printed circuit board fixed to a positioning unit while moving a pick and place head in an X-Y direction by an X-Y table.

Since the above-described conventional means must include two types of electrical component placing apparatuses of rotary head and single head types and use the particular type of apparatus depending upon the type of electrical component, the operation and management of the apparatuses are complicated, and the facility cost is raised as well.

SUMMARY OF THE INVENTION

Accordingly, an object of this invention is to provide a rotary head type electrical component placing apparatus which can place not only an electrical component contained in a tape but an electrical component contained in a tray onto a printed circuit board.

In order to achieve this and other objects, the present invention provides another table different from a table for placing a feeder such as a tape unit in a body, provides an electrical component placing unit in the table, and provides an electrical component supplying device for reciprocating it on the body laterally integrally with the table.

The electrical component supplying device is composed of a tray supplying unit having a tray containing an electrical component and a sub pick and place head for picking and placing the electrical component contained in the tray to the placing unit.

With the arrangement described above, the electrical component contained in the tray of the tray supplying unit is picked up by the sub pick and place head and placed onto the placing unit. The electrical component picked and placed on the placing unit is picked up by the pick and place head of a rotary head, and picked and placed onto a printed circuit board. If there is no electrical component in the placing unit, the electrical component of the tray is supplied to the placing unit by the sub pick and place head.

These and other objects and features of the present invention will become apparent from the following detailed description in conjunction with the attached drawings.

DESCRIPTION OF THE PREFERRED EMBODIMENT

An embodiment of a rotary head type electrical component placing apparatus according to the present invention will now be described with reference to the accompanying drawings.

Figure 1:
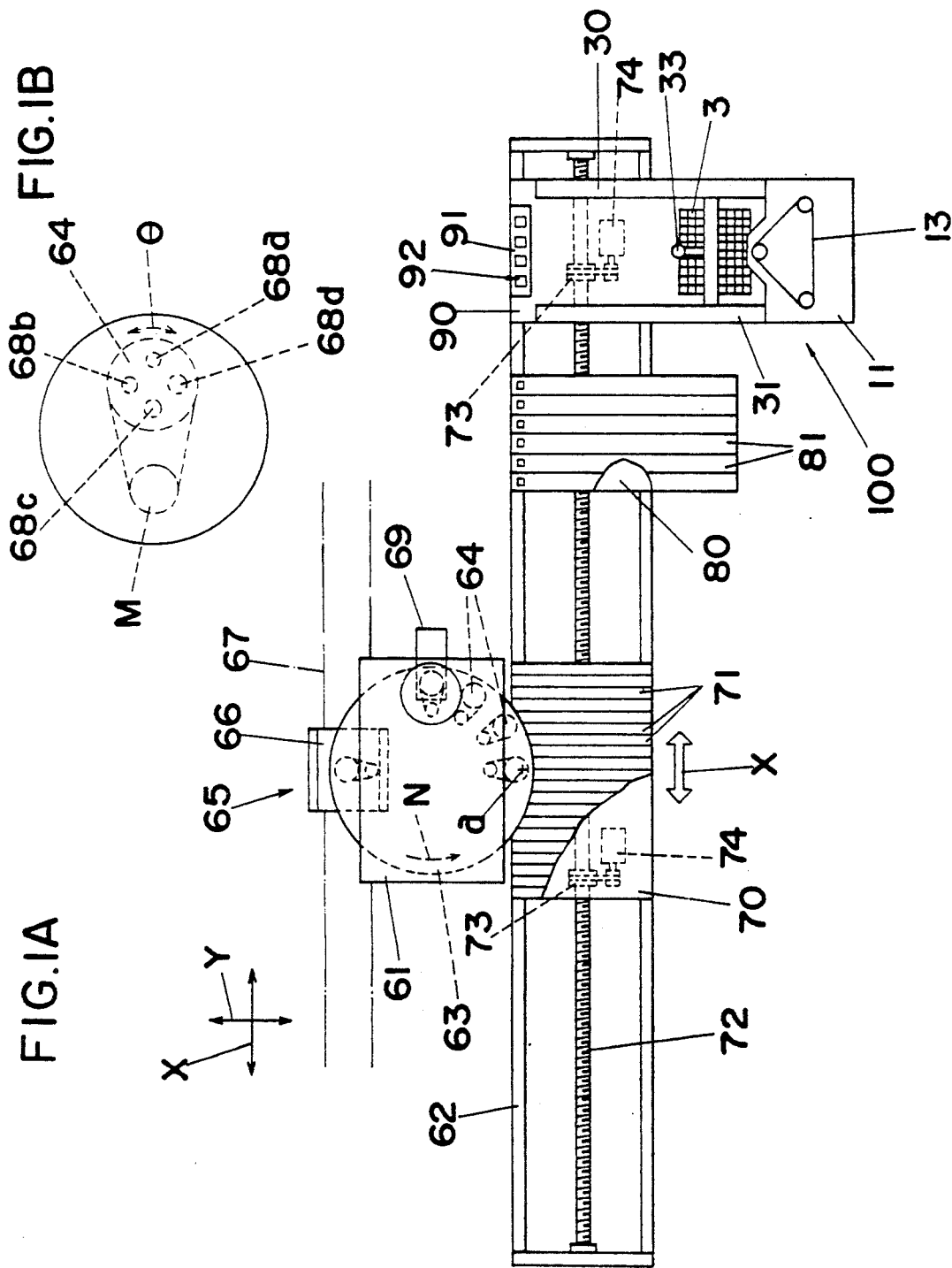
FIG. 1A is a plan view of a rotary head type electrical component placing apparatus according to an embodiment of the present invention.
FIG. 1B is a view showing details of the apparatus of FIG. 1A.

FIG. 1 is a plan view of a rotary head type electrical component placing apparatus of the invention. The rotary head type electrical component placing apparatus of the embodiment comprises a placing apparatus body 61, and a supporting body 62 provided behind the placing apparatus body 61. The apparatus body 61 has a rotary head 63 which undergoes indexed rotation in a direction of an arrow N in FIG. 1A. The rotary head type electrical component placing apparatus comprises a pick and place head 64 provided in parallel with the rotary head 63 along its circumferential direction. The pick and place head 64 picks up an electrical component of the body 62 by the rotation of the rotary head 63, and places the electrical component on a printed circuit board 66 positioned on an X-Y table 65. A conveyor 67 is provided to convey the printed circuit board 66 to the X-Y table 65 and to deliver it from the X-Y table 65. The pick and place head 64 has a plurality of nozzles 68a, 68b, 68c and 68d. A motor M is driven to rotate the pick and place head 64 in directions of arrows θ in FIG. 1B to select an optimum nozzle for the electrical component to be picked up from the plurality of nozzles 68a to 68d.

A first table 70 is placed on the body 62. A number of tape units 71 as feeders are placed on the table 70. A ball screw 72 is provided in the body 62. A nut 73 engaged with the ball screw 72 and a motor 74 are mounted underneath the table 70. When the motor 74 is driven, the table 70 is reciprocated in a lateral direction X along the ball screw 72 to stop a desired tape unit 71 at a pick-up position a. As described above, the ball screw 72, the nut 73 and the motor 74 constitute means for moving the table 70. The pick and place head 64 picks up the electrical component at the pick-up position a, and picks and places it on the printed circuit board 66 by the index rotation of the rotary head 63 in the direction of the arrow N in FIG. 1A. An electrical component of relatively small size such as an IC chip, a chip condenser, a chip resistor is provided in the tape unit 71.

In FIG. 1A, a second table 80 is provided on the body 62. A plurality of tube feeders 81 as feeders are placed on the second table 80. An electrical component having leads in two directions such as an SOP is provided in the tube feeder 81. When the table 80 is reciprocated in the lateral direction X, a desired tube feeder 81 is stopped at the pick-up position a, the electrical component of the tube feeder 81 is picked up by the pick and place head 64, and placed on the printed circuit board 66.

Figure 2:
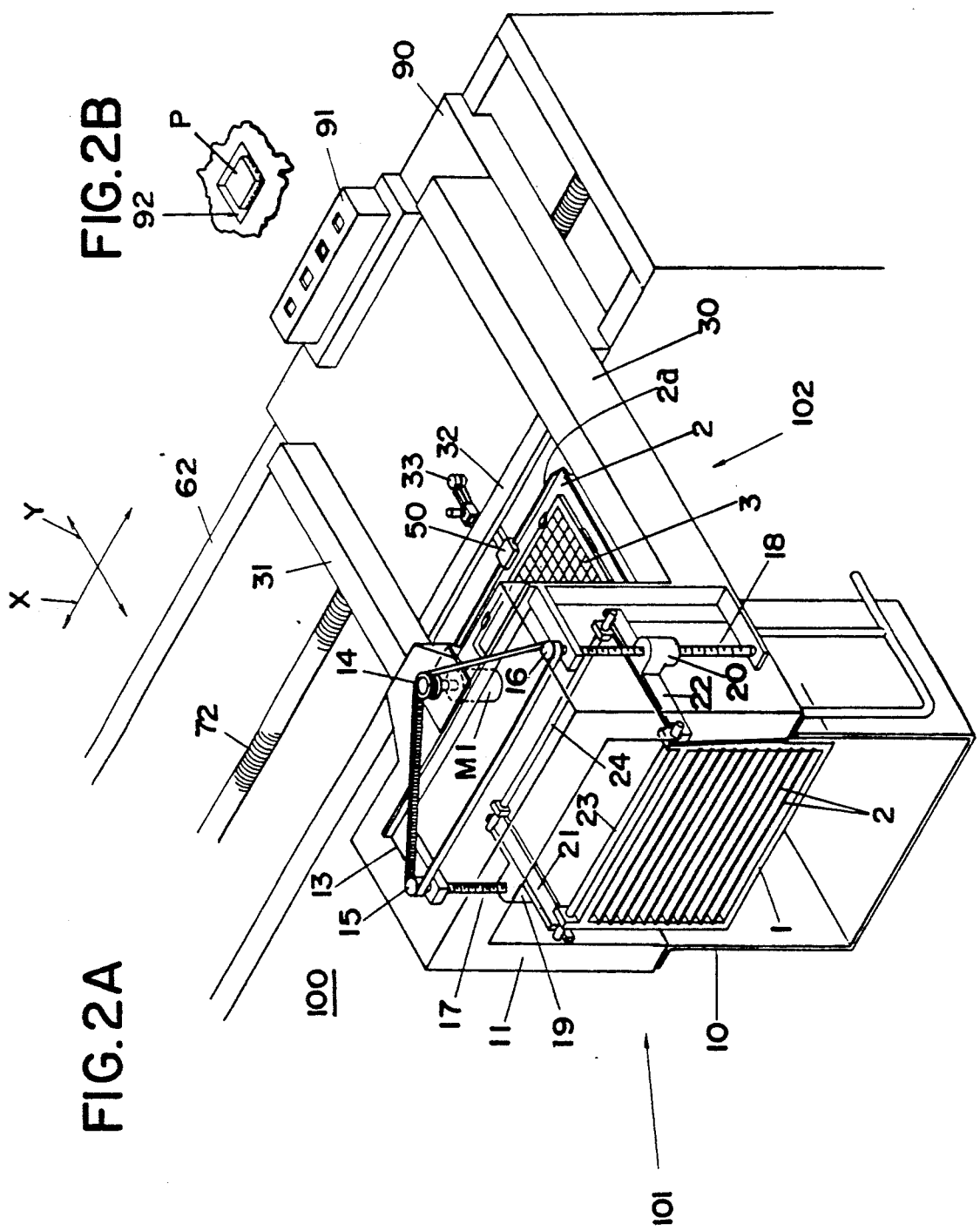
FIG. 2A is a perspective view of a body of the apparatus.
FIG. 2B is a view showing details of the apparatus of FIG. 2A.

In FIGS. 1A and 2A, a third table 90 is provided on the body 62 separately from the table 70. An electrical component supplying device 100 for supplying the electrical component is integrally provided with the table 90. The electrical component supplying device 100 is coupled to the table 90, and reciprocates integrally with the table 90 in the lateral direction X in FIG. 1A, on the body 62.

An electrical component placing unit 91 is provided at the front of the table 90. As will be described in more detail, the electrical component P (see FIG. 2B) picked and placed in the pocket 92 of the placing unit 91 is picked up by the pick and place head 64, and placed on the printed circuit board 66. The shape of the pocket 92 as an electrical component positioning means can be arbitrarily designed. The number of the pockets 92 is arbitrary. In case that a plurality of the pockets 92 are provided as in this embodiment, the shapes and sizes of the respective pockets 92 may be altered to contain electrical components P of different types in the respective pockets 92. Referring to FIGS. 1A and 2A, the detailed structure of the electrical component supplying device 100 will now be described.

The electrical component supplying device 100 has a tray supplying unit 101 and a tray drawing unit 102. The tray supplying unit 101 will be first described. The tray supplying unit 101 has a box-shaped magazine. A plurality of stages of trays 3 each mounted on a base plate 2 are stacked and contained in the magazine 1. The tray 3 contains an electrical component P of relatively large shape having leads in four directions such as a QFP. A lower frame 10 and an upper frame 11 are provided. The magazine 1 is disposed in the frames 10 and 11.

A motor M1 is mounted in the upper frame 11, and a timing belt 13 is driven by the motor M1 to rotate along timing pulleys 14, 15 and 16. The timing pulleys 15, 16 are disposed at both sides of the upper frame 11, and ball screws 17 to be driven by the timing pulleys 15, 16 are suspended vertically along both sidewalls of the frame 11. Nuts 19 and 20 are respectively engaged with the ball screws 17 and 18. Brackets 21 and 22 are provided integrally with the nuts 19 and 20, respectively.

Two shafts 23 and 24 are laterally installed on the upper surface of the magazine 1, and the brackets 21 and 22 are supported at both ends of the two shafts 23 and 24. Therefore, when the motor M1 is normally or reversely rotated, the ball screws 17 and 18 are rotated, and the nuts 19 and 20 rise or fall along the ball screws 17 and 18 to raise or lower the magazine 11. That is, the ball screws 17, 18, the nuts 19, 20 and the motor M1 constitute means for raising and lowering the magazine 1.

Arms 30 and 31 are extended at the table 90 side. The base plate 2 in which the tray 3 is placed is drawn on a plate 7 (see FIG. 3) provided between the arms 30 and 31 by the tray drawing unit 102. The arms 30 and 31 are coupled to the table 90.

Figure 3:
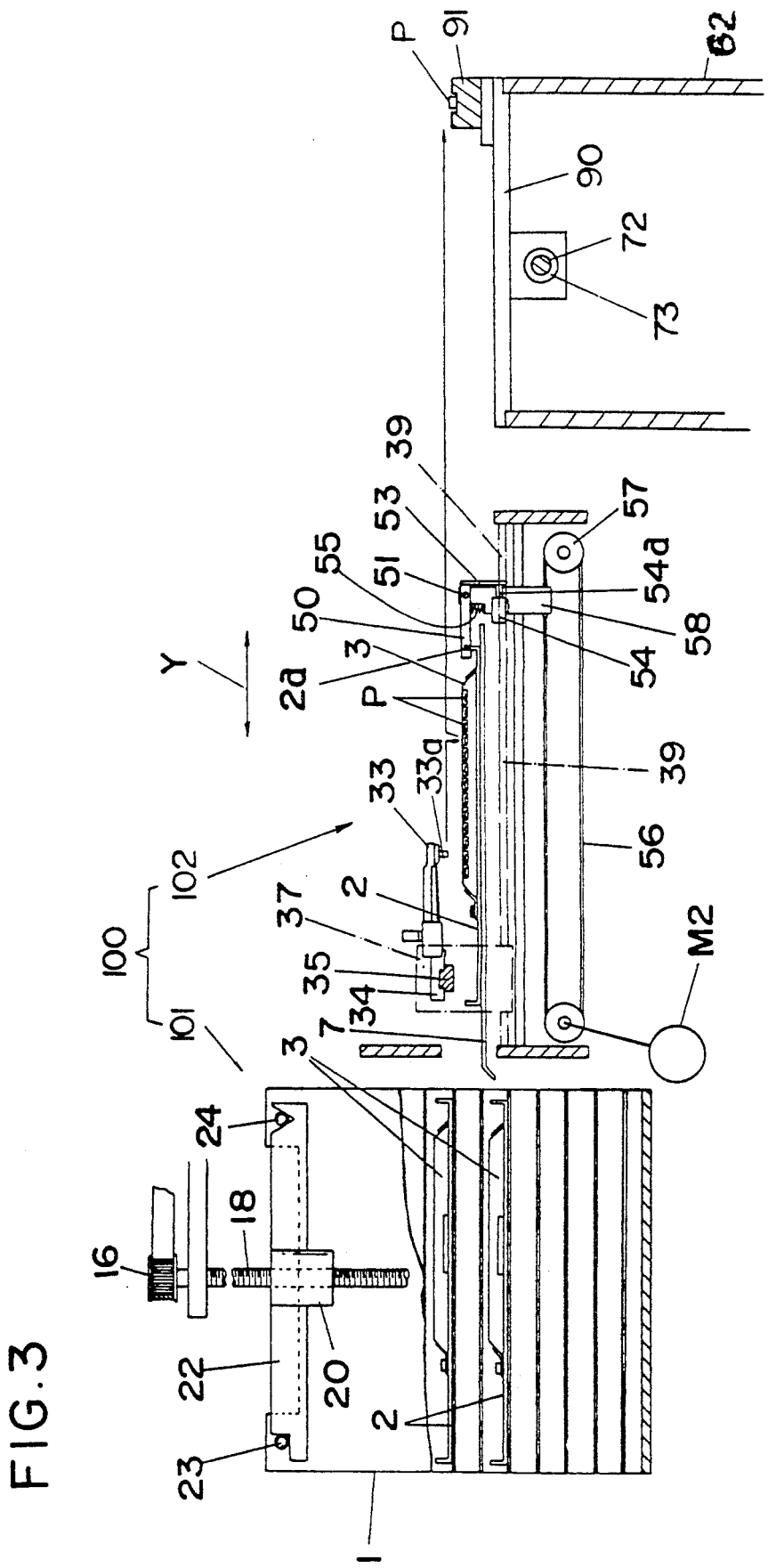
FIG. 3 is a side view of an electrical component supplying device.

A cover plate 32 is bridged between the arms 30 and 31, and a sub pick and place head 33 is provided over the cover plate 32. As shown in FIG. 3, the end of the sub pick and place head 33 is attached to a slider 34. The slider 34 is installed at a guide rail 35 provided inside the cover plate 32 to be slidably in the direction X. A nozzle 33a is provided at the sub pick and place head 33 for attracting the electrical component P.

Figure 4:
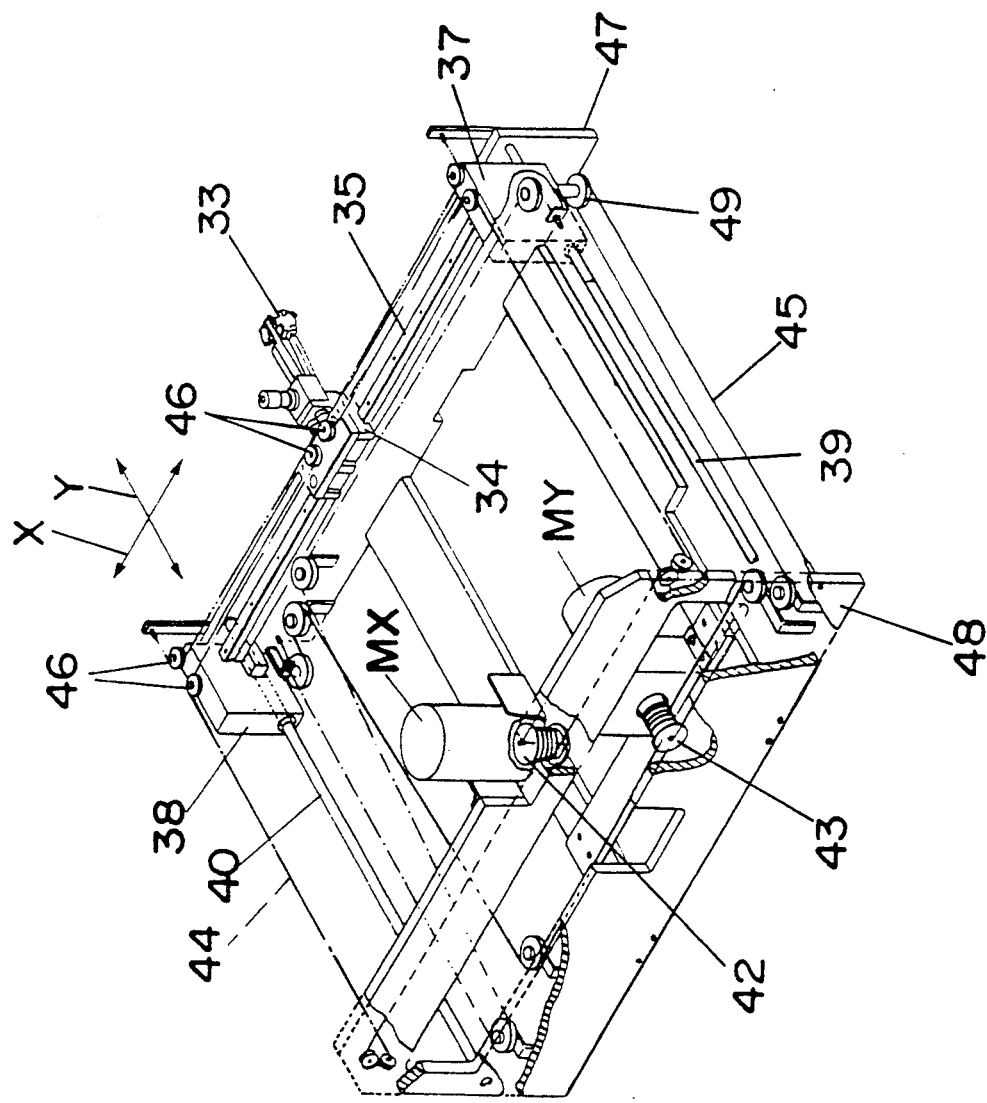
FIG. 4 is a perspective view of a driving mechanism of a sub pick and place head of the apparatus.

FIG. 4 shows a driving system for the sub pick and place head 33 provided under the plate 7. Sliders 37 and 38 are attached to both ends of the guide rail 35. The sliders 37 and 38 are mounted slidably in the direction Y along guide rods 39 and 40 disposed in the arms 30 and 31. An X-direction motor MX, an X-axis winding drum 42, a Y-direction motor MY, and a Y-axis winding drum 43 are provided. An X-direction wire 44 and a Y-direction wire 45 are respectively wound on the drums 42 and 43.

The X-direction wire 44 is wound at bearings 46 provided at the slider 34, the sliders 37, 38, etc. When the motor MX is normally or reversely rotated, the slider 34 in which the sub pick and place head 33 is mounted is cause to slide along the guide rail 35 in the direction X. The Y-direction wire 45 is wound at bearings 49 provided at the corners of frames 47 and 48. When the motor MY is normally or reversely rotated, the sliders 37 and 38 move along the rods 39 and 40 in the direction Y, and the sub pick and place head 33 coupled to the sliders 37 and 38 is moved in the same direction as the direction Y. In other words, the motors MX, MY, the slider 34, the rail 35, the sliders 37, 38, the rods 39, 40, the winding drums 42, 43, the wires 44, 45, the bearings 46, 49, etc , constitute a device for moving the sub pick and place head 33 in X and Y directions.

In FIGS. 2A and 3, a detachable element 50 is detachably attached to the front wall 2a of the base plate 2. The detachable element 50 is supported rotatably to a pin 51. An arm 53 extended downward from the detachable element 50 is attached to the rod 54a of a cylinder 54. The detachable element 50 is energized in a direction for separating from the front wall 2a (clockwise in FIG. 3) by a spring 55. When the spring 55 is actuated to project the rod 54a, the detachable element 50 rotates counterclockwise in FIG. 3 against the elastic force of the spring 55 to be engaged with the front wall 2a. When the cylinder 54 stops actuating, the detachable element 50 is rotated upward in FIG. 3 by the elastic force of the spring 55 to separate from the front wall 2a. That is and cylinder 54, the spring 55 constitute a device for attaching and detaching the detachable element 50.

In FIG. 3, a belt 56 is would at pulleys 57 under the plate 7. A drive motor M2 is provided, and a movable member 58 is attached to the belt 56. The cylinder 54 is attached to the movable member 58. When the motor M2 is driven, the detachable element 50 pulls the base plate 2 in which the tray 3 is provided to move it in the direction Y in FIG. 3. In other words, the belt 56, the pulleys 57, the movable member 58, the motor M2, etc., constitute a telescoping device for drawing the tray 3 contained in the magazine 1 to the placing unit 91 of the table 90 and replacing it in the magazine 1. The arrangement of the electrical component supplying device is not limited to the particular embodiment of the invention described above. In summary, the electrical component supplying device may place the electrical component contained in the tray on the placing unit by the sub pick and place head.

The embodiment of the apparatus of the invention is constructed as described above, and the overall operation of the apparatus will now be described.

The case that the electrical component on the table 70 is placed on the printed circuit board 66 will be first described. As shown in FIG. 1A, the table 70 is moved behind the apparatus body 61, and the table 80 and the table 90 are retracted rightward in FIG. 1A. The motor 74 is driven in this state to stop a desired tape unit 71 at the pick-up position a, while reciprocating the table 70 in the lateral direction X. Then, the electrical component P is picked up by the pick and place head 64, and fed and placed on the printed circuit board 66 by index rotating the rotary head 63 in the direction N in FIG. 1A. When the X-Y table 65 is driven and the printed circuit board 66 is moved in the X-Y direction, the electrical component is placed at a predetermined position on the printed circuit board 66.

Now, the case where an electrical component of the tube feeder 81 on the table 80 is placed on the printed circuit board 66 will be described. In this case, the table 70 is retracted leftward in FIG. 1A, and the table 80 is moved behind the apparatus body 61. Subsequently, the table 80 is reciprocated in the lateral direction X, and the desired tube feeder 81 is stopped at the pick-up position a. Then, the electrical component is picked up by the pick and place head 64 and placed on the printed circuit board 66.

Now, the case where an electrical component of the tray 3 is placed on the printed circuit board 66 will be described. In this case, the table 70 and the table 80 are retracted leftward in FIG. 1A, and the table 90 is disposed behind the apparatus body 61. Thereafter, the table 90 is reciprocated in the lateral direction X in FIG. 1A, and the electrical component P placed in the pocket 92 of the placing unit 91 is stopped at the pick-up position a. Subsequently, the electrical component P is picked up by the pick and place head 64 and placed on the printed circuit board 66. When this operation is finished, the table 90 is retracted rightward in FIG. 1A, the table 70 or the table 80 is again moved behind the apparatus body 61 as described above, and the electrical component is placed on the printed circuit board 66. When the tape unit 90 is retracted rightward in FIG. 1A, the electrical component P of the tray is supplied to the pocket 92 of the placing unit 91 by the sub pick and place head 33. Generally, the consumption of the electrical components provided in the tube feeders 81 and the trays 3 are considerably reduced as compared with that of the electrical components provided in the table units 71. Therefore, the two tables 80 and 90 may be integrated, and the tube feeders 81 and the electrical component supplying device 100 may be placed on the same table. Also, the electrical components of the tube feeders 81 and the electrical component supplying device 100 may be placed on the printed circuit board 66 while reciprocating both the tube feeders 81 and the electrical component supplying device 100 integrally on the body 62. Only one electrical component P may be placed on the placing unit 91. In this case, each time an electrical component P is picked up by the pick and place head 64, the electrical component P of the tray 3 may be supplied one by one to the pick-up position a by the sub pick and place head 33. In this instance, since the table 90 is stopped in the state that the electrical component P is placed on the placing unit 91, a positioning means for the electrical component P like the pocket 92 need not be formed.

According to the apparatus of the present invention, not only an electrical component mounted in a feeder such as the tape unit 71 or the tuber feeder 81 but an electrical component provided in the tray 3 can be placed on the printed circuit board 66. Particularly, since the table 90 having small consumption of the electrical components is provided separately from the table 70 having large consumption of the electrical components and they are separately reciprocated, the operating efficiency can be improved.

In the case where the type of the electrical component P to be placed on the printed circuit board 66 is altered or in the case where there is no electrical component P on tray 3 is lacked, the tray 3 is replaced as will be described below. The detachable element 50 first pulls the base plate 2 to move it to the magazine 1 side and contains the tray 3 used so far in the magazine 1. The detachable element 50 is rotated upward in FIG. 1A, to separate from the front wall 2a.

Then, when the motor M1 is driven, the magazine 1 is raised or lowered, and the tray 3 in which a predetermined electrical component P is contained is stopped at a position opposed to the detachable element 50. Subsequently, the cylinder 54 is operated, and the detachable element 50 is engaged with the front wall 2a of the base plate 2. Then, the motor M2 is driven, the base plate 2 is pulled by the detachable element 50, drawn on the plate 7, and the electrical component P of the tray 3 is then placed on the placing unit 91 by the sub pick and place head 33.

According to the present invention as described above, not only an electrical component such as a chip condenser or a chip resistor provided in the feeders but also an electrical component such as a QFP provided in the tray can be efficiently and advantageously placed on the printed circuit board.

What is claimed is:

1. An electrical component placing apparatus comprising:
   supporting means;
   a first table mounted on said supporting means;
   a rotary head adapted to undergo indexed rotation and including a pick and place head;
   an X-Y table for moving a printed circuit board in X-Y directions;
   a second table mounted on said supporting means and having an electrical component placing portion;
   electrical component supplying means mounted on said second table; and
   means for laterally reciprocatingly moving said first table and said second table independently of one another relative to said supporting means;
   said electrical component supplying means including a tray supplying unit having at least one tray for containing an electrical component and a sub pick and place head for picking up the electrical component contained in said tray and placing it onto said placing portion of said second table.

2. An electrical component placing apparatus as in claim 1, wherein said placing portion has a pocket, and said sub pick and place head is adapted to pick up the electrical component contained in said tray and place it in said pocket.

3. An electrical component placing apparatus as in claim 1, wherein said tray supplying unit includes a magazine for containing said tray, means for raising and lowering said magazine, and tray drawing means for drawing out said tray contained in said magazine to move said tray toward said placing portion.

4. An electrical component placing apparatus as in claim 1, further comprising means for driving said sub pick and place head in said X-Y directions so as to enable the electrical component to be transferred from said tray to said placing portion.

* * * * *